United States Patent
Gu et al.

(10) Patent No.: US 11,502,153 B2
(45) Date of Patent: Nov. 15, 2022

(54) ARRAY SUBSTRATE AND DISPLAY DEVICE WITH INTERPOSER BONDED TO DRIVE CIRCUIT AND MANUFACTURING METHOD THEREOF

(71) Applicant: BOE Technology Group Co., Ltd., Beijing (CN)

(72) Inventors: Renquan Gu, Beijing (CN); Qi Yao, Beijing (CN); Jaiil Ryu, Beijing (CN); Zhiwei Liang, Beijing (CN); Yingwei Liu, Beijing (CN); Wusheng Li, Beijing (CN); Muxin Di, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 261 days.

(21) Appl. No.: 16/761,823

(22) PCT Filed: Mar. 26, 2019

(86) PCT No.: PCT/CN2019/079644
§ 371 (c)(1),
(2) Date: May 6, 2020

(87) PCT Pub. No.: WO2020/191607
PCT Pub. Date: Oct. 1, 2020

(65) Prior Publication Data
US 2021/0217837 A1    Jul. 15, 2021

(51) Int. Cl.
*H01L 27/32* (2006.01)
(52) U.S. Cl.
CPC ...... *H01L 27/3276* (2013.01); *H01L 27/3258* (2013.01); *H01L 2227/323* (2013.01)

(58) Field of Classification Search
CPC ............ H01L 27/3276; H01L 27/3258; H01L 2227/323
See application file for complete search history.

(56) References Cited

U.S. PATENT DOCUMENTS

| 6,376,288 B1 | 4/2002 | Jen et al. |
| 2003/0008437 A1* | 1/2003 | Inoue ............ H01L 21/76254 438/149 |

(Continued)

FOREIGN PATENT DOCUMENTS

| CN | 105552085 A | 5/2016 |
| CN | 106384740 A | 2/2017 |

(Continued)

OTHER PUBLICATIONS

International search report of PCT application No. PCT/CN2019/079644 dated Dec. 31, 2019.

*Primary Examiner* — Lex H Malsawma
(74) *Attorney, Agent, or Firm* — Fay Sharpe LLP (57) ABSTRACT

An array substrate and a manufacturing method thereof, a display device and a manufacturing method thereof are provided, which belong to the technical field of display. The array substrate includes: an interposer substrate, a thin-film transistor disposed on one side of the interposer substrate, and a bonding connection line embedded in the other side of the interposer substrate. The bonding connection line is configured to be connected to a drive circuit. An interposer via hole is arranged on the interposer substrate. A conductive structure is arranged in the interposer via hole. The thin-film transistor is electrically connected to the bonding connection line by the conductive structure.

14 Claims, 6 Drawing Sheets

(56) References Cited

U.S. PATENT DOCUMENTS

| | | | |
|---|---|---|---|
| 2003/0024635 A1* | 2/2003 | Utsunomiya | H01L 21/2007 156/155 |
| 2003/0168969 A1* | 9/2003 | Tanabe | H01L 27/3251 313/500 |
| 2005/0017268 A1* | 1/2005 | Tsukamoto | H01L 27/3251 257/200 |
| 2016/0013091 A1* | 1/2016 | Kim | H01L 23/49827 438/109 |
| 2016/0163765 A1* | 6/2016 | Hu | H01L 51/0097 438/34 |
| 2017/0301724 A1* | 10/2017 | Lee | H01L 27/156 |
| 2021/0202530 A1* | 7/2021 | Yao | H01L 29/66757 |

FOREIGN PATENT DOCUMENTS

| | | |
|---|---|---|
| CN | 107256870 A | 10/2017 |
| JP | 2010243525 A | 10/2010 |

* cited by examiner

ARRAY SUBSTRATE AND DISPLAY DEVICE WITH INTERPOSER BONDED TO DRIVE CIRCUIT AND MANUFACTURING METHOD THEREOF

CROSS-REFERENCE TO RELATED APPLICATION

This application is a 371 of PCT/CN2019/079644, filed on Mar. 26, 2019, the content of which is incorporated herein by reference.

TECHNICAL FIELD

The present disclosure relates to the technical field of display, and in particular, relates to an array substrate and a manufacturing method thereof, and a display device and a manufacturing method thereof.

BACKGROUND

With the rapid development of display technology, full screen has become the focus of research in the field of display technology. Narrowing the bezel of the display screen is a prerequisite for achieving a full screen.

SUMMARY

The present disclosure provides an array substrate and a manufacturing method thereof, and a display device and a manufacturing method thereof. The technical solutions are as follows:

In one aspect, an array substrate is provided. The array substrate includes:

an interposer substrate, a thin-film transistor disposed on one side of the interposer substrate, and a bonding connection line embedded in the other side of the interposer substrate, the bonding connection line being configured to be connected to a drive circuit;

wherein an interposer via hole is arranged on the interposer substrate, a conductive structure is arranged in the interposer via hole, and the thin-film transistor is electrically connected to the bonding connection line by the conductive structure.

Optionally, the bonding connection line includes a first lead and a second lead that are insulated from each other, the interposer via hole includes a first interposer via hole and a second interposer via hole, a gate of the thin-film transistor is electrically connected to the first lead by the conductive structure in the first interposer via hole, and one of a source and a drain of the thin-film transistor is electrically connected to the second lead by the conductive structure in the second interposer via hole;

wherein the first lead is configured to be connected to a gate drive circuit in the drive circuit, and the second lead is configured to be connected to a data drive circuit in the drive circuit.

Optionally, the thin-film transistor is a thin-film transistor with a bottom-gate structure, and the gate of the thin-film transistor and the conductive structure in the first interposer via hole are integrally formed.

Optionally, a material of the interposer substrate includes an organic resin material.

In another aspect, a manufacturing method of an array substrate is provided. The method includes:

forming a bonding connection line on a carrier substrate;

forming an interposer substrate on the carrier substrate having the bonding connection line, wherein the interposer substrate has an interposer via hole;

forming a thin-film transistor and a conductive structure in the interposer via hole on a side of the interposer substrate distal from the carrier substrate, wherein the thin-film transistor is electrically connected to the bonding connection line by the conductive structure in the interposer via hole; and peeling off the carrier substrate.

Optionally, the bonding connection line includes a first lead and a second lead insulated from each other, and forming the interposer substrate on the carrier substrate having the bonding connection line includes:

forming a substrate layer on the carrier substrate having the bonding connection line is formed; and forming the interposer via hole on the substrate layer to obtain the interpose substrate, wherein the interposer via hole includes a first interposer via hole and a second interposer via hole;

wherein a conductive structure is arranged in each of the first interposer via hole and the second interposer, a gate of the thin-film transistor is electrically connected to the first lead by the conductive structure in the first interposer via hole, one of a source and a drain of the thin-film transistor is electrically connected to the second lead by the conductive structure in the second interposer via hole, the first lead is configured to be connected to a gate drive circuit in the drive circuit, and the second lead is configured to be connected to a data drive circuit in the drive circuit.

Optionally, forming the substrate layer on the carrier substrate having the bonding connection line includes:

coating an organic resin material on the carrier substrate having the bonding connection line to form the substrate layer.

Optionally, before forming the bonding connection line on the carrier substrate, the method further includes:

forming a sacrificial layer on the carrier substrate by using a separation material, wherein an adhesion between the separation material and the carrier substrate is greater than an adhesion between the bonding connection line and the interposer substrate, and the bonding connection line is formed on a side of the sacrificial layer distal from the carrier substrate; and peeling off the carrier substrate includes:

irradiating the sacrificial layer with laser from a side of the carrier substrate distal from the thin-film transistor to separate the sacrificial layer from the bonding connection line and the interposer substrate to peel off the carrier substrate.

Optionally, the separation material includes one of an amorphous silicon material and an organic resin material.

Optionally, forming the thin-film transistor and the conductive structure in the interposer via hole on the side of the interposer substrate distal from the carrier substrate includes:

forming a conductive layer on the side of the interposer substrate distal from the carrier substrate by using a conductive material;

patterning the conductive layer to form a gate and the conductive structure in the interposer via hole; and sequentially forming a gate insulating layer, an active layer pattern, and a source-drain pattern on the interposer substrate having the gate.

Optionally, forming the thin-film transistor and the conductive structure in the interposer via hole on the side of the interposer substrate distal from the carrier substrate includes:

forming a conductive layer on the side of the interposer substrate distal from the carrier substrate by using a conductive material;

patterning the conductive layer to form the conductive structure in the interposer via hole; and forming the thin-film transistor on the interposer substrate having the conductive structure.

In yet another aspect, a display device is provided. The display device includes: a light-emitting unit and an array substrate according to the above aspect;

wherein the light-emitting unit is disposed on a side of the thin-film transistor in the array substrate distal from the interposer substrate.

Optionally, the display device further includes a drive circuit;

wherein the drive circuit is disposed on a side of the interposer substrate distal from the thin-film transistor, and the drive circuit is connected to the bonding connection line in the array substrate.

Optionally, the light-emitting unit includes one of a micro light-emitting diode, an organic light-emitting diode, and a quantum dot light-emitting diode.

In still another aspect, a manufacturing method of a display device is provided. The method includes:

forming a bonding connection line on a carrier substrate;

forming an interposer substrate on the carrier substrate having the bonding connection line, wherein the interposer substrate has an interposer via hole;

forming a thin-film transistor and a conductive structure in the interposer via hole on a side of the interposer substrate distal from the carrier substrate, wherein the thin-film transistor is electrically connected to the bonding connection line by the conductive structure in the interposer via hole;

forming a light-emitting unit on a side of the thin-film transistor distal from the carrier substrate; and peeling off the carrier substrate.

Optionally, after peeling off the carrier substrate, the method further includes:

forming a drive circuit on a side of the interposer substrate having the bonding connection line by a bonding process, wherein the drive circuit is connected to the bonding connection line.

Optionally, before peeling off the carrier substrate, the method further includes:

adhering the side of the interposer substrate having the light-emitting unit with a fixed substrate by an ultraviolet adhesive; and after forming the drive circuit on the side of the interposer substrate having the bonding connection line by the bonding process, the method further includes:

peeling off the fixed substrate.

Optionally, peeling off the fixed substrate includes:

irradiating the ultraviolet adhesive with ultraviolet light from a side of the fixed substrate distal from the interposer substrate to separate the fixed substrate from the light-emitting unit.

DETAILED DESCRIPTION

The present disclosure will be described in further detail with reference to the accompanying drawings, to present the objects, technical solutions, and advantages of the present disclosure more clearly.

The related art provides an interposer substrate. The interposer substrate is arranged with a plurality of interposer via holes, each of which is filled with a conductive material. One side of the interposer substrate is configured to prepare devices such as a thin-film transistor and a light-emitting unit, and the other side of the interposer substrate is configured to provide a drive circuit (Integrated Circuit, IC). The drive IC includes a gate drive circuit and a data drive circuit. One of a source and a drain in the thin-film transistor is electrically connected to the data drive circuit through the interposer via hole on the interposer substrate, and a gate of the thin-film transistor is electrically connected to the gate drive circuit through the interposer via hole on the interposer substrate. Because of a display device prepared based on the interposer substrate does not need a drive IC at the bezel, the bezel of the display device can be narrowed, thereby realizing a full screen.

However, before providing the drive IC on the interposer substrate, it is necessary to form a bonding pad on the interposer substrate through a plating process or a chemical mechanical polishing (CMP) process. The bonding pad is configured to be connected to the drive IC and the thin-film transistor. After a display device is formed on one side of the interposer substrate, the display device is easily damaged in response to a bonding pad is formed on the other side of the interposer substrate. After the bonding pad is formed on the other side of the interposer substrate, the bonding pad is easily damaged in response to a display device is formed on one side of the interposer substrate. Therefore, the process of preparing a display device by using an interposer substrate is currently difficult.

Figure 1:
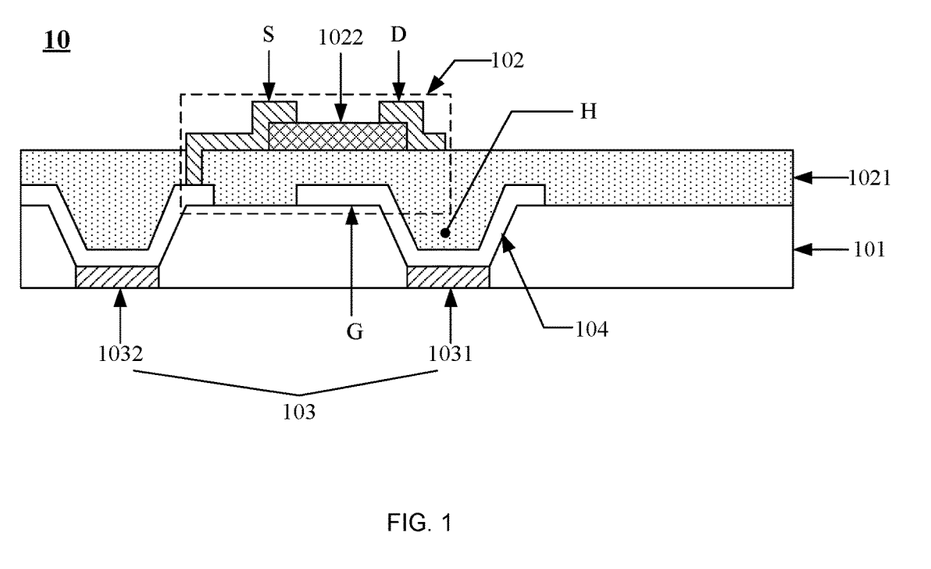
FIG. 1 is a schematic structural diagram of an array substrate according to an embodiment of the present disclosure.

FIG. 1 is a schematic structural diagram of an array substrate according to an embodiment of the present disclosure. As shown in FIG. 1, the array substrate 10 includes:

an interposer substrate 101, a thin-film transistor 102 disposed on one side of the interposer substrate 101, and a bonding connection line 103 embedded in the other side of the interposer substrate 101. The bonding connection line 103 is configured to be connected to a drive circuit (not shown in the figure). In the embodiment of the present disclosure, the interposer substrate 101 refers to a substrate that has an interposer via hole.

Referring to FIG. 1, an interposer via hole H is arranged on the interposer substrate 101, and a conductive structure 104 is arranged in the interposer via hole H. The thin-film transistor 102 is electrically connected to the bonding connection line 103 by the conductive structure 104.

In summary, the array substrate according to the embodiment of the present disclosure is fabricated by forming a bonding connection line on a carrier substrate, then forming an interposer substrate on the carrier substrate having the bonding connection line, further forming a thin-film transistor on a side of the interposer substrate distal from the carrier substrate, and finally peeling off the carrier substrate. Therefore, the bonding connection line is embedded in the interposer substrate. Because of the bonding connection line, the interposer substrate and the thin-film transistor are sequentially formed on the carrier substrate, compared with the related art, there is no need to separately prepare the bonding connection line and the thin-film transistor on both sides of the existing interposer substrate, which improves the production yield of the array substrate, and reduces the process difficulty.

Optionally, the material for fabricating the interposer substrate 101 may include an organic resin material. Exemplarily, the material for fabricating the interposer substrate includes at least one of a polyimide (PI) resin material, a polyester resin material, and a polyolefin resin material. In response to the interposer substrate is made of the PI resin material, the interposer substrate may be referred to as a Through PI Via (TPV) substrate.

Optionally, the thin-film transistor may be a thin-film transistor with a bottom-gate structure. For example, referring to FIG. 1, the thin-film transistor 102 includes a gate G, a gate insulating layer 1021, an active layer pattern 1022, and a source-drain pattern that are stacked in a direction distal from the interposer substrate 101. The source-drain pattern includes a source S and a drain D.

Figure 2:
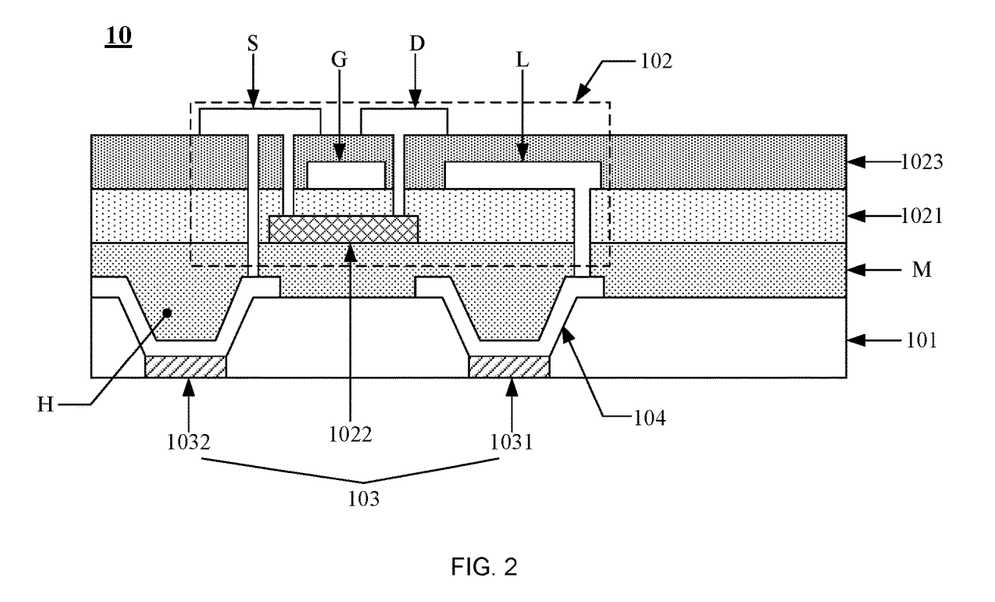
FIG. 2 is a schematic structural diagram of another array substrate according to an embodiment of the present disclosure.

Optionally, the thin-film transistor may also be a thin-film transistor with a top-gate structure. For example, FIG. 2 is a schematic structural diagram of another array substrate according to an embodiment of the present disclosure. As shown in FIG. 2, the thin-film transistor 102 includes an active layer pattern 1022, a gate insulating layer 1021, a gate pattern, a passivation layer 1023, and a source-drain pattern that are stacked in a direction distal from the interposer substrate 101. The gate pattern includes a gate G and a gate lead L. The source-drain pattern includes a source S and a drain D. The active layer pattern 1022 is insulated from the conductive structure 104 in the interposer via hole H. For example, referring to FIG. 2, an insulating layer M may be arranged between the active layer pattern 1022 and the interposer substrate 101.

Optionally, the material for fabricating the conductive structure includes at least one of aluminum (Al), neodymium (Nd), and molybdenum (Mo). The material for fabricating the gate includes at least one of aluminum, neodymium, and molybdenum. The material for fabricating the source-drain pattern includes at least one of aluminum, neodymium, and molybdenum. The material for fabricating the active layer pattern includes at least one of Indium Gallium Zinc Oxide (IGZO), Low Temperature Poly-silicon (LTPS) and Low Temperature Polycrystalline Oxide (LTPO).

Optionally, referring to FIG. 1 and FIG. 2, the bonding connection line 103 may include at least a first lead 1031 and a second lead 1032 insulated from each other. The interposer via hole H may include at least a first interposer via hole and a second interposer via hole. The gate G of the thin-film transistor 102 is electrically connected to the first lead 1031 by the conductive structure 104 in the first interposer via hole. One of the source S and the drain D of the thin-film transistor 102 is electrically connected to the second lead 1032 by the conductive structure 104 in the second interposer via hole. For example, in FIG. 1 and FIG. 2, the source S of the thin-film transistor 102 is electrically connected to the second lead 1032 by the conductive structure in the second interposer via hole. The first lead 1031 is configured to be connected to a gate drive circuit in the drive circuit. The second lead 1032 is configured to be connected to a data drive circuit in the drive circuit. Optionally, the bonding connection line may further include other leads, for example, may include a lead for connecting a power control circuit and the like.

Optionally, referring to FIG. 1, in response to the thin-film transistor 102 is the thin-film transistor with the bottom-gate structure, the gate G of the thin-film transistor 102 and the conductive structure 104 in the first interposer via hole may are integrally formed.

It should be noted that the gate of the thin-film transistor and the conductive structure in the first interposer via hole are integrally formed. That is, the gate of the thin-film transistor and the conductive structure in the first interposer via hole may be prepared at the same layer, which simplifies the fabrication process of the array substrate.

In summary, the array substrate according to the embodiment of the present disclosure is fabricated by forming a bonding connection line on a carrier substrate, then forming an interposer substrate on the carrier substrate having the bonding connection line, further forming a thin-film transistor on a side of the interposer substrate distal from the carrier substrate, and finally peeling off the carrier substrate, such that the bonding connection line is embedded in the interposer substrate. Since the bonding connection line, the interposer substrate and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, reduces the process difficulty, and also reduces the fabrication cost of the array substrate.

An embodiment of the present disclosure provides a display device, the display device includes a light-emitting unit and an array substrate 10 as shown in FIG. 1 or FIG. 2.

Figure 3:
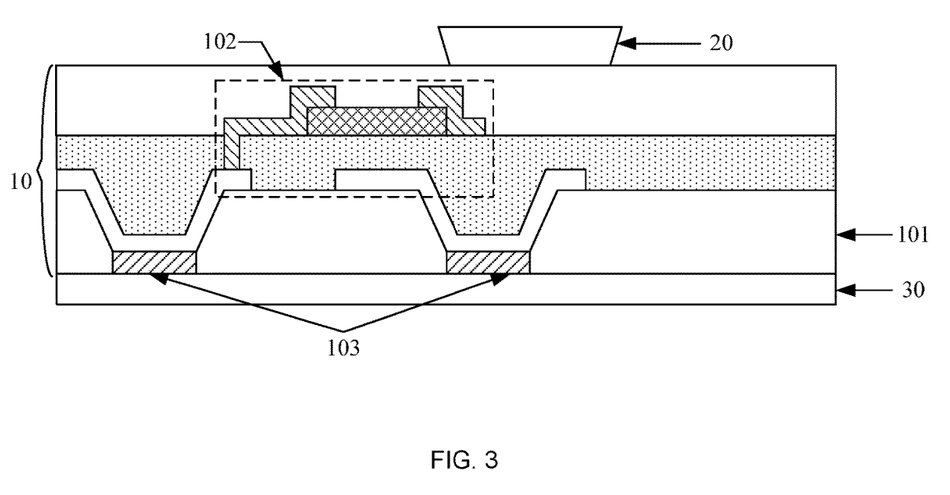
FIG. 3 is a schematic structural diagram of a display device according to an embodiment of the present disclosure.

For example, FIG. 3 is a schematic structural diagram of a display device according to an embodiment of the present disclosure. The display device includes an array substrate 10 as shown in FIG. 1. As shown in FIG. 3, a light-emitting unit 20 in the display device is disposed on a side of the thin-film transistor 102 in the array substrate 10 distal from the interposer substrate 101.

Optionally, continue to refer to FIG. 3, the display device further includes a drive circuit 30. The drive circuit 30 is disposed on a side of the interposer substrate 101 distal from the thin-film transistor 102, and the drive circuit 30 is connected to the bonding connection line 103 in the array substrate 10.

It should be noted that the drive circuit may include a gate drive circuit and a data drive circuit. The gate drive circuit is configured to provide a gate drive signal to the gate of the thin-film transistor. The data drive circuit is configured to provide a data drive signal to one of the source and the drain of the thin-film transistor. In the embodiment of the present disclosure, the drive circuit may be a drive IC.

Optionally, the light-emitting unit 20 may include one of a micro light-emitting diode (Micro LED, also referred to as u-LED), an organic light-emitting diode (OLED), and quantum dot light-emitting Diode (QLED). In response to the light-emitting unit is the u-LED, the light-emitting unit may be fixedly arranged on the array substrate by bonding.

In summary, the display device according to the embodiment of the present disclosure, wherein the array substrate is fabricated by forming a bonding connection line on a carrier substrate, then forming an interposer substrate on the carrier substrate on which the bonding connection line is formed, further forming a thin-film transistor is on a side of the interposer substrate distal from the carrier substrate, and finally peeling off the carrier substrate, such that the bonding connection line is embedded in the interposer substrate. Since the bonding connection line, the interposer substrate and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, reduces the process difficulty, and then improves the reliability of the fabricated display device.

Figure 4:
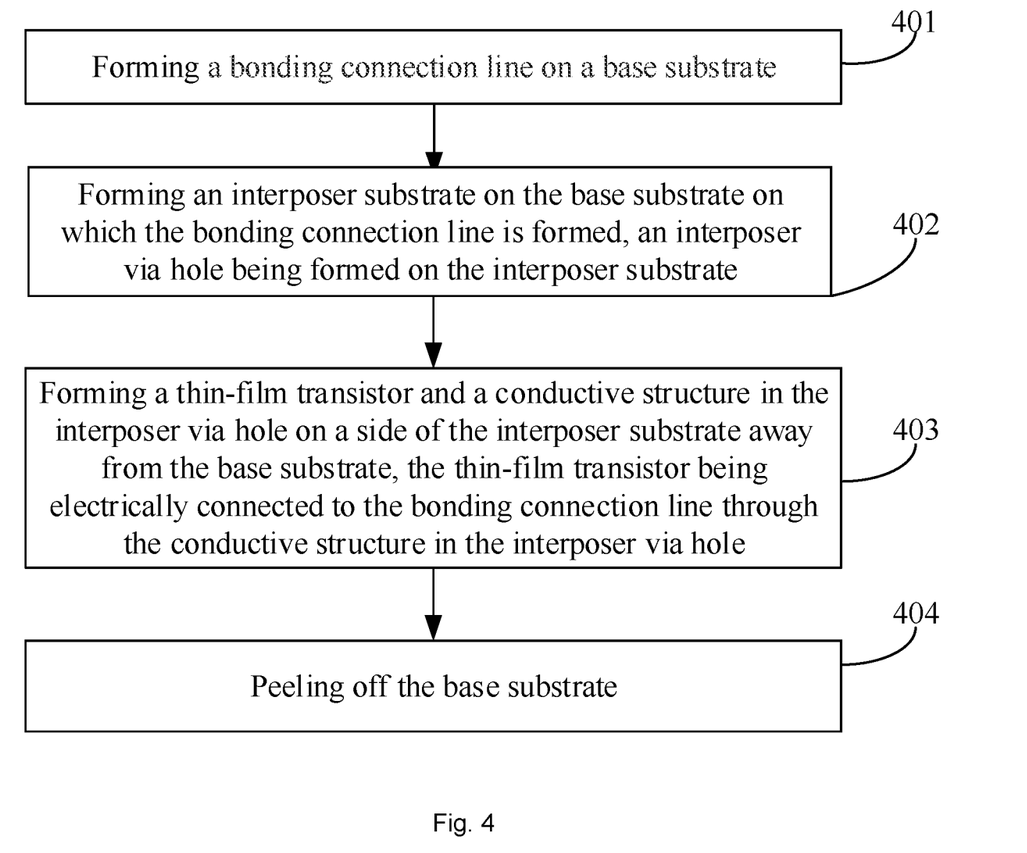
FIG. 4 is a flowchart of a manufacturing method of an array substrate according to an embodiment of the present disclosure.

FIG. 4 is a flowchart of a manufacturing method of an array substrate according to an embodiment of the present disclosure. As shown in FIG. 4, the method includes the following steps.

In step 401, a bonding connection line is formed on a carrier substrate.

In step 402, an interposer substrate is formed on the carrier substrate having the bonding connection line. The interposer substrate has an interposer via hole.

In step 403, a thin-film transistor and a conductive structure in the interposer via hole are formed on a side of the interposer substrate distal from the carrier substrate. The thin-film transistor is electrically connected to the bonding connection line by the conductive structure in the interposer via hole.

In step 404, the carrier substrate is peeled off.

In summary, in the manufacturing method of an array substrate according to the embodiment of the present disclosure, a bonding connection line is formed on a carrier substrate, then an interposer substrate is formed on the carrier substrate having the bonding connection line, further a thin-film transistor is formed on a side of the interposer substrate distal from the carrier substrate, and finally the carrier substrate is peeled off to obtain the array substrate. Since the bonding connection line, the interposer substrate and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, and reduces the process difficulty.

Figure 5:
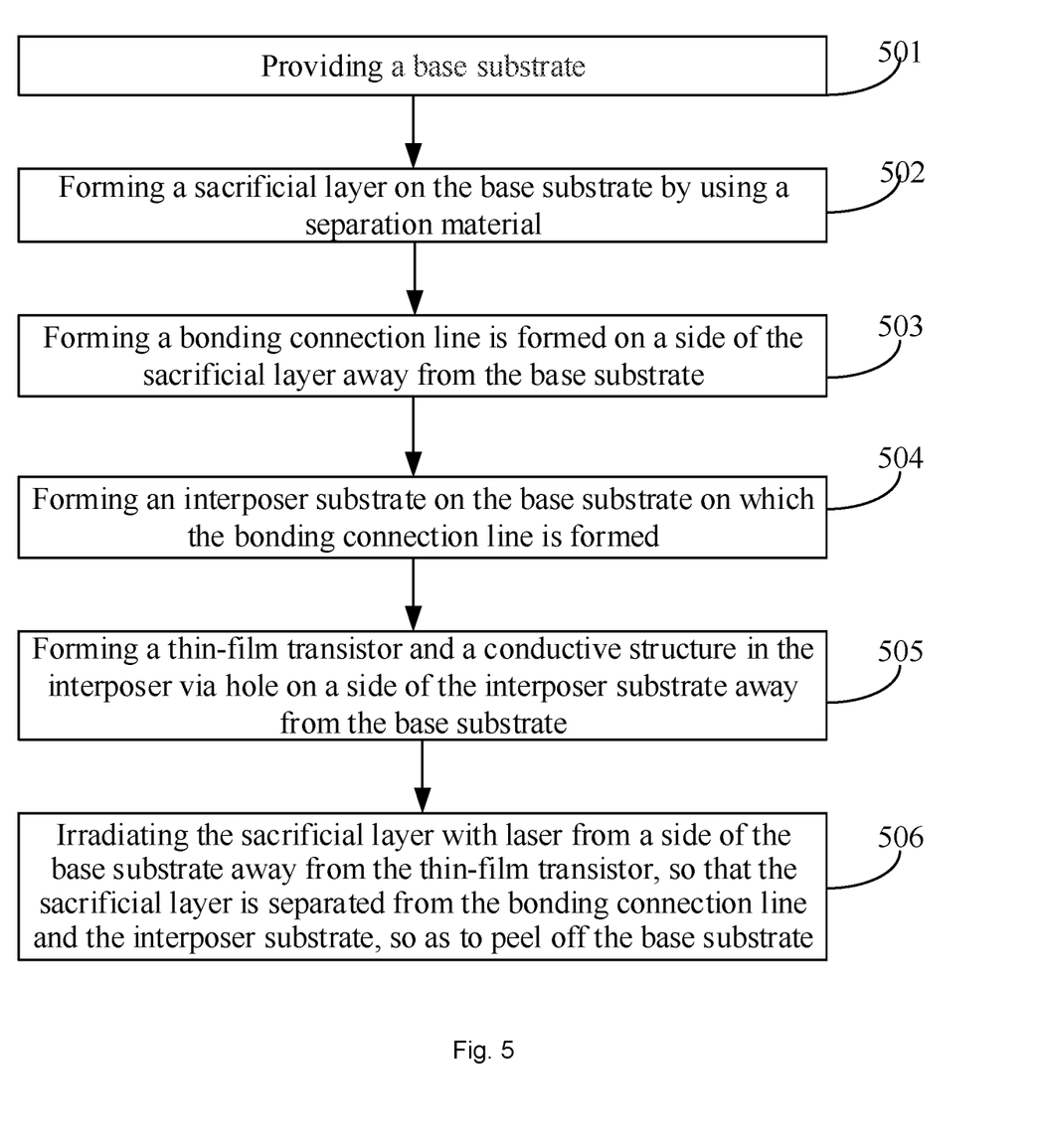
FIG. 5 is a flowchart of another manufacturing method of an array substrate according to an embodiment of the present disclosure.

FIG. 5 is a flowchart of another manufacturing method of an array substrate according to an embodiment of the present disclosure. As shown in FIG. 5, the method includes the following steps.

In step 501, a carrier substrate is provided.

Optionally, the material for fabricating the carrier substrate includes at least one of glass, silicon wafer, quartz, and plastic, which is not limited in the embodiment of the present disclosure.

In step 502, a sacrificial layer is formed on the carrier substrate by using a separation material.

An adhesion between the separation material and the carrier substrate is greater than an adhesion between the bonding connection line and the interposer substrate. That is, the sacrificial layer is easier to be separated from the bonding connection line and the interposer substrate under an external effect. In addition, the separation material also has high temperature resistance, which avoids changing the properties of the sacrificial layer during the subsequent film layer fabrication process and affecting the fabrication of the array substrate.

Optionally, the separation material includes one of an amorphous silicon material and an organic resin material. For example, the separation material may be a PI resin material or the like.

Optionally, the separation material may be coated on the carrier substrate to form the sacrificial layer.

In step 503, a bonding connection line is formed on a side of the sacrificial layer distal from the carrier substrate.

Optionally, the bonding connection line is formed on a side of the sacrificial layer distal from the carrier substrate through a patterning process, a sputtering process, or an evaporation process. A material of the bonding connection line may be copper, silver or other metals. The material and fabrication method of the bonding connection line are not limited in the embodiment of the present disclosure. The patterning process includes photoresist coating, exposure, development, etching, and photoresist stripping.

Optionally, the bonding connection line includes a first lead and a second lead insulated from each other. The first lead is configured to be connected to a gate drive circuit in a drive circuit. The second lead is configured to be connected to a data drive circuit in the drive circuit. Optionally, the bonding connection line may further include other leads, for example, may include a lead for connecting a power control circuit and the like.

In step 504, an interposer substrate is formed on the carrier substrate having the bonding connection line.

Optionally, the implementation process of step 504 includes the following steps.

In step 5041, a substrate layer is formed on the carrier substrate having the bonding connection line.

Optionally, the substrate layer is formed on the carrier substrate having the bonding connection line through a coating and a low temperature curing process using an organic resin material.

Optionally, the substrate layer is formed on the carrier substrate having the bonding connection through an attach process.

In step 5042, an interposer via hole is formed on the substrate layer to obtain an interposer substrate. The interposer via hole includes a first interposer via hole and a second interposer via hole.

A gate of the thin-film transistor is electrically connected to the first lead by the conductive structure in the first interposer via hole. One of a source and a drain of the thin-film transistor is electrically connected to the second lead by the conductive structure in the second interposer via hole. The first lead is configured to be connected to the gate drive circuit in the drive circuit. The second lead is configured to be connected to the data drive circuit in the drive circuit.

Optionally, an overlap region may be defined between an orthographic projection of the first interposer via hole formed on the substrate layer on the carrier substrate and an orthographic projection of the first lead on the carrier substrate, such that the conductive structure in the first interposer via hole is electrically connected to the first lead; and an overlap region may be defined between an orthographic projection of the second interposer via hole formed on the substrate layer on the carrier substrate and an orthographic projection of the second lead on the carrier substrate, such that the conductive structure in the second interposer via hole is electrically connected to the second lead.

Optionally, the interposer via hole is formed on the substrate layer by an etching process. For example, the interposer via hole may be formed on the substrate layer by an inductive coupled plasma (ICP) etching process.

In step 505, a thin-film transistor and a conductive structure in the interposer via hole are formed on a side of the interposer substrate distal from the carrier substrate.

In an optional embodiment of the present disclosure, in response to the thin-film transistor is a thin-film transistor with a bottom-gate structure, the implementation process of step 505 includes the following steps.

In step 5051a, a conductive layer is formed on a side of the interposer substrate distal from the carrier substrate by using a conductive material.

Optionally, the conductive material may be formed on a side of the interposer substrate distal from the carrier substrate by deposition, sputtering, or evaporation. The conductive material includes at least one of aluminum, neodymium, and molybdenum.

In step 5052a, the conductive layer is patterned to form a gate and the conductive structure in the interposer via hole.

Optionally, the conductive layer may be patterned by a patterning process.

It should be noted that, by patterning the conductive layer, a gate and a conductive structure in the interposer via hole may be formed at the same time, which simplifies the fabrication process of the array substrate. Alternatively, the gate and the conductive structure in the interposer via hole may also be formed separately. For example, the conductive structure in the interposer via hole is formed firstly by a patterning process, and then the gate is formed by a patterning process.

Further, a gate insulating layer, an active layer pattern, and a source-drain pattern may be sequentially formed on the interposer substrate having the gate. The implementation process refers to the following steps 5053a to 5055a.

In step 5053a, a gate insulating layer is formed on the interposer substrate having the gate.

Optionally, a material for fabricating the gate insulating layer includes at least one of silicon dioxide, silicon nitride, and aluminum oxide. For example, the gate insulating layer may be formed on the interposer substrate having the gate by deposition.

In step 5054a, an active layer pattern is formed on the interposer substrate having the gate insulating layer.

Optionally, a material for fabricating the active layer pattern includes at least one of IGZO, LTPS, and LTPO. For example, a patterning process may be used to form the active layer pattern on the interposer substrate having the gate insulating layer.

In step 5055a, a source-drain pattern is formed on the interposer substrate having the active layer pattern.

Optionally, a material for fabricating the source-drain pattern includes at least one of aluminum, neodymium, and molybdenum. For example, a patterning process may be used to form the source-drain pattern on the interposer substrate having the active layer pattern.

In another optional embodiment of the present disclosure, in response to the thin-film transistor is a thin-film transistor with a top-gate structure, the implementation process of step 505 includes: forming a conductive layer on a side of the interposer substrate distal from the carrier substrate by using a conductive material; patterning the conductive layer to form the conductive structure in the interposer via hole; and forming the thin-film transistor on the interposer substrate having the conductive structure. The fabrication process of the thin-film transistor includes the following steps.

In step 5051b, an active layer pattern is formed on the interposer substrate having the conductive structure in the interposer via hole, the active layer pattern being insulated from the conductive structure in the interposer via hole.

The material and fabrication method of the active layer pattern can refer to the above-mentioned step 5054a, which are not described in detail herein.

In step 5052b, a gate insulating layer is formed on the interposer substrate having the active layer pattern.

For the material and fabrication method of the gate insulating layer, reference may be made to the above-mentioned step 5053a, which are not described in detail herein.

In step 5053b, a gate is formed on the interposer substrate having the gate insulating layer.

For the material and fabrication method of the gate, reference may be made to the above-mentioned step 5051a, which are not described in detail herein.

In step 5054b, a passivation layer is formed on the interposer substrate having the gate.

Optionally, a material for fabricating the passivation layer includes at least one of silicon dioxide, silicon nitride, and aluminum oxide. For example, the passivation layer may be formed on the interposer substrate having the gate by deposition.

In step 5055b, a source-drain pattern is formed on the interposer substrate having the passivation layer.

For the material and fabrication method of the source-drain pattern, reference may be made to the above-mentioned step 5055a, which are not described in detail herein.

In step 506, the sacrificial layer is irradiated with laser from a side of the carrier substrate distal from the thin-film transistor, such that the sacrificial layer is separated from the bonding connection line and the interposer substrate, so as to peel off the carrier substrate.

It should be noted that in response to the carrier substrate is a glass substrate or other substrate that is difficult to be separated from metal materials (bonding connecting line), by forming a sacrificial layer on the carrier substrate, and after preparing the thin-film transistor, separating the sacrificial layer from the bonding connection line to realize the peeling off of the carrier substrate, which can avoid damage to the bonding connection line and improve the reliability of the fabricated of the array substrate.

In summary, in the manufacturing method of an array substrate according to the embodiment of the present disclosure, a bonding connection line is formed on a carrier substrate, then an interposer substrate is formed on the carrier substrate having the bonding connection line, further a thin-film transistor is formed on a side of the interposer substrate distal from the carrier substrate, and finally the carrier substrate is peeled off to obtain the array substrate. Since the bonding connection line, the interposer substrate and the thin-film transistor are sequentially formed on the carrier substrate, compared with the related art, there is no need to separately fabricate the bonding connection line and the thin-film transistor on both sides of the existing interposer substrate, which improves the fabrication yield of the array substrate, reduces the process difficulty, and also reduces the fabrication cost of the array substrate.

Figure 6:
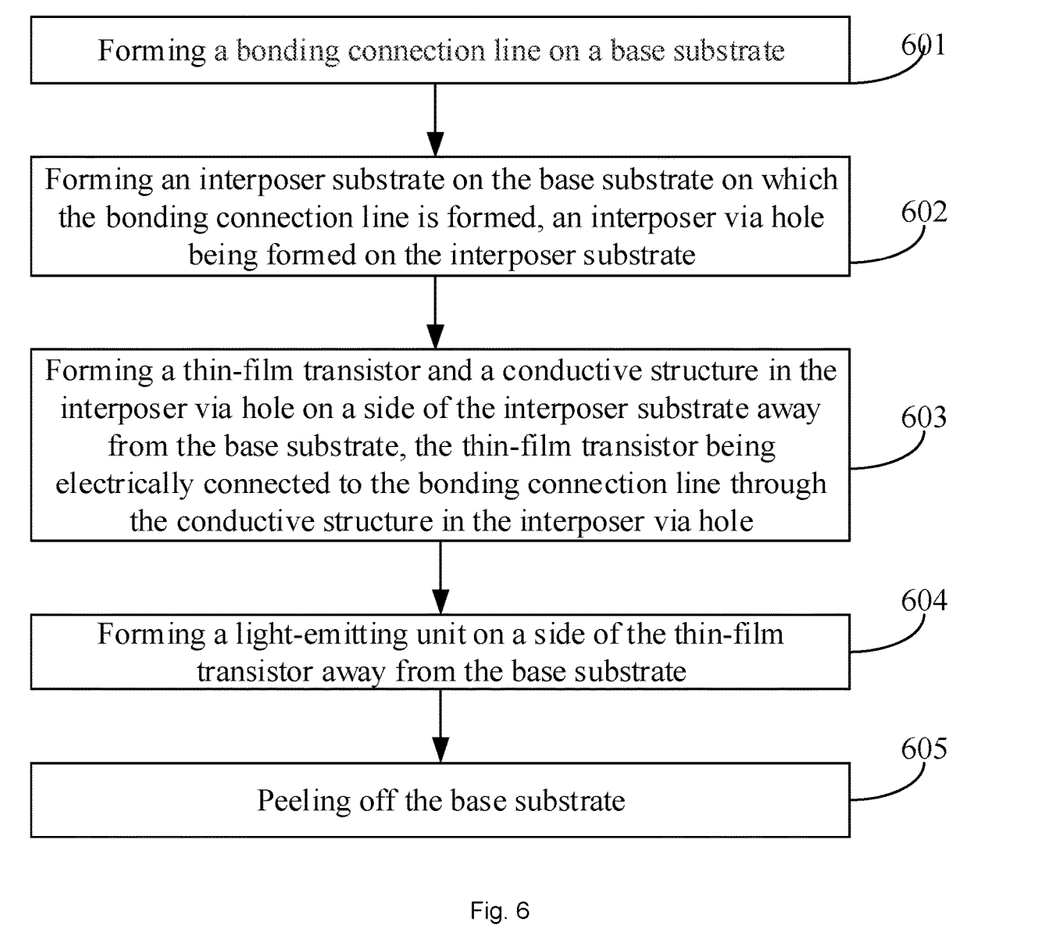
FIG. 6 is a flowchart of a manufacturing method of a display device according to an embodiment of the present disclosure.

FIG. 6 is a flowchart of a manufacturing method of a display device according to an embodiment of the present disclosure. As shown in FIG. 6, the method includes the following steps.

In step 601, a bonding connection line is formed on a carrier substrate.

In step 602, an interposer substrate is formed on the carrier substrate having the bonding connection line. The interposer substrate has an interposer via hole.

In step 603, a thin-film transistor and a conductive structure in the interposer via hole are formed on a side of the interposer substrate distal from the carrier substrate. The thin-film transistor is electrically connected to the bonding connection line by the conductive structure in the interposer via hole.

In step 604, a light-emitting unit is formed on a side of the thin-film transistor distal from the carrier substrate.

In step 605, the carrier substrate is peeled off.

Optionally, for the implementation process of the above steps 601 to 603 and 605, reference may be made to the relevant steps in the above-mentioned fabrication process of the array substrate, which are not described in detail herein.

Optionally, the light-emitting unit includes one of u-LED, OLED, and QLED. In response to the light-emitting unit is the u-LED, the implementation process of step 604 may include: providing the u-LED on a side of the thin-film transistor distal from the carrier substrate by transfer, and fixing the u-LED by bonding.

In summary, in the manufacturing method of a display device according to the embodiment of the present disclosure, a bonding connection line is formed on a carrier substrate, then an interposer substrate is formed on the carrier substrate having the bonding connection line, further a thin-film transistor and a light-emitting unit are sequentially formed on a side of the interposer substrate distal from the carrier substrate, and finally the carrier substrate is peeled off. Since the bonding connection line, the interposer substrate and the thin-film transistor are sequentially formed on the carrier substrate, compared with the related art, there is no need to separately prepare the bonding connection line and the thin-film transistor on both sides of the existing interposer substrate, which improves the fabrication yield of the array substrate, reduces the process difficulty, and thus improves the reliability of the fabricated display device.

It should be noted that, after the carrier substrate is peeled off, the bonding connection line on the side of the interposer substrate distal from the thin-film transistor is exposed. Optionally, after the carrier substrate is peeled off, a drive circuit is formed on a side of the interposer substrate having the bonding connection line by a bonding process, and the drive circuit is connected to the bonding connection line.

Figure 7:
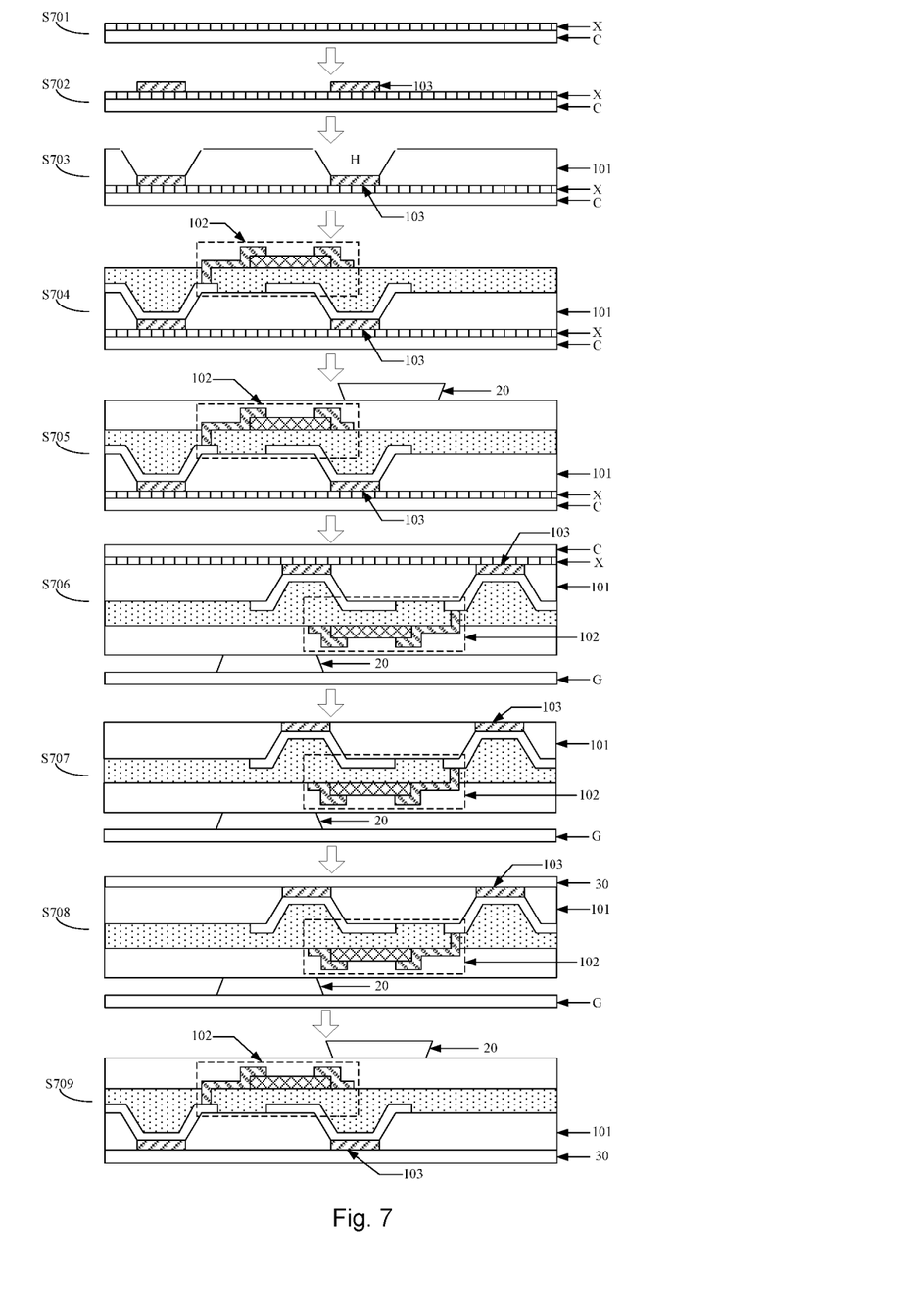
FIG. 7 is a flowchart of a manufacturing process of a display device according to an embodiment of the present disclosure.

Exemplarily, FIG. 7 is a flowchart of a manufacturing process of a display device according to an embodiment of the present disclosure. As shown in FIG. 7, including the following steps.

In S701, a sacrificial layer X is formed on a carrier substrate C.

In S702, a bonding connection line 103 is formed on a side of the sacrificial layer X distal from the carrier substrate C.

In S703, an interposer substrate 101 is formed on the carrier substrate C having the bonding connection line 103.

Referring to FIG. 7, the interposer substrate 101 has an interposer via hole H.

In S704, a thin-film transistor 102 is formed on a side of the interposer substrate 101 distal from the carrier substrate C.

Optionally, for the implementation process of the above S701 to S704, reference may be made to the above steps 501 to 505, which are not described in detail herein.

In S705, a light-emitting unit 20 is formed on a side of the thin-film transistor 102 distal from the carrier substrate C.

In S706, the side of the interposer substrate 101 having the light-emitting unit 20 is adhered to a fixed substrate G by an ultraviolet adhesive.

In S707, the sacrificial layer X is irradiated with laser from a side of the carrier substrate C distal from the thin-film transistor 102, such that the sacrificial layer X is separated from the bonding connection line 103 and the interposer substrate 101, to peel off the carrier substrate C.

In S708, a drive circuit 30 is formed on a side of the interposer substrate 101 having the bonding connection line 103 by a bonding process. The drive circuit 30 is connected to the bonding connection line 103.

In S709, the fixed substrate is peeled off to obtain a display device.

Optionally, the ultraviolet adhesive is irradiated with ultraviolet light from a side of the fixed substrate distal from the interposer substrate to separate the fixed substrate from the light-emitting unit.

In summary, in the manufacturing method of a display device according to the embodiment of the present disclosure, a bonding connection line is formed on a carrier substrate, then an interposer substrate is formed on the carrier substrate having the bonding connection line, further a thin-film transistor and a light-emitting unit are sequentially formed on a side of the interposer substrate distal from the carrier substrate, and finally the carrier substrate is peeled off. Since the bonding connection line, the interposer substrate and the thin-film transistor are sequentially formed on the carrier substrate, compared with the related art, there is no need to separately fabricate the bonding connection line and the thin-film transistor on both sides of the existing interposer substrate, which improves the fabrication yield of the array substrate, reduces the process difficulty, and thus improves the reliability of the fabricated display device.

It should be noted that the order of steps in the manufacturing method of an array substrate and the manufacturing method of a display device according to the embodiments of the present disclosure may be appropriately adjusted, and the steps may be increased or decreased correspondingly according to circumstances. Any skilled in the art can easily think of changes within the technical scope disclosed in this disclosure which should be covered by the protection scope of this disclosure, and is not described in detail herein.

Described above are merely optional embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. An array substrate, comprising:
    an interposer substrate, a thin-film transistor disposed on one side of the interposer substrate, and a bonding connection line embedded in the other side of the interposer substrate;
    wherein the bonding connection line comprises a first lead and a second lead that are insulated from each other, the first lead being configured to be connected to a gate drive circuit in the drive circuit, and the second lead being configured to be connected to a data drive circuit in the drive circuit; and
    an interposer via hole is arranged on the interposer substrate, a conductive structure is arranged in the interposer via hole, the interposer via hole comprises a first interposer via hole and a second interposer via hole, a gate of the thin-film transistor is electrically connected to the first lead by the conductive structure in the first interposer via hole, and one of a source and a drain of the thin-film transistor is electrically connected to the second lead by the conductive structure in the second interposer via hole;

wherein the thin-film transistor is a thin-film transistor with a bottom-gate structure and the gate of the thin-film transistor and the conductive structure in the first interposer via hole are integrally formed.

2. The array substrate according to claim 1, wherein; a material of the interposer substrate comprises an organic resin material.

3. A manufacturing method of an array substrate, comprising:
forming a bonding connection line on a carrier substrate;
forming an interposer substrate on the carrier substrate having the bonding connection line, wherein the interposer substrate has an interposer via hole;
forming a thin-film transistor and a conductive structure in the interposer via hole on a side of the interposer substrate distal from the carrier substrate, wherein the thin-film transistor is electrically connected to the bonding connection line by the conductive structure in the interposer via hole; and
peeling off the carrier substrate;
wherein forming the thin-film transistor and the conductive structure in the interposer via hole on the side of the interposer substrate distal from the carrier substrate comprises:
forming a conductive layer on the side of the interposer substrate distal from the carrier substrate by using a conductive material;
patterning the conductive layer to form a gate and the conductive structure in the interposer via hole; and
sequentially forming a gate insulating layer, an active layer pattern, and a source-drain pattern on the interposer substrate having the gate.

4. The method according to claim 3, wherein the bonding connection line comprises a first lead and a second lead insulated from each other, and forming the interposer substrate on the carrier substrate having the bonding connection line comprises:
forming a substrate layer on the carrier substrate having the bonding connection line; and
forming the interposer via hole on the substrate layer to obtain the interposer substrate, wherein the interposer via hole comprises a first interposer via hole and a second interposer via hole;
wherein a conductive structure is arranged in each of the first interposer via hole and the second interposer via hole, a gate of the thin-film transistor is electrically connected to the first lead by the conductive structure in the first interposer via hole, one of a source and a drain of the thin-film transistor is electrically connected to the second lead by the conductive structure in the second interposer via hole, the first lead is configured to be connected to a gate drive circuit in the drive circuit, and the second lead is configured to be connected a data drive circuit in the drive circuit.

5. The method according to claim 4, wherein forming the substrate layer on the carrier substrate having the bonding connection line comprises:
coating and curing an organic resin material on the carrier substrate having the bonding connection line to form the substrate layer.

6. The method according to claim 3, wherein before forming the bonding connection line on the carrier substrate, the method further comprises:

forming a sacrificial layer on the carrier substrate by using a separation material, wherein an adhesion between the separation material and the carrier substrate is greater than an adhesion between the bonding connection line and the interposer substrate, and the bonding connection line is formed on a side of the sacrificial layer distal from the carrier substrate; and peeling off the carrier substrate comprises:
irradiating the sacrificial layer with laser from a side of the carrier substrate distal from the thin-film transistor to separate the sacrificial layer from the bonding connection line and the interposer substrate to peel off the carrier substrate.

7. The method according to claim 6, wherein:
the separation material comprises one of an amorphous silicon material and an organic resin material.

8. The method according to claim 3, wherein forming the thin-film transistor and the conductive structure in the interposer via hole on the side of the interposer substrate distal from the carrier substrate comprises:
forming a conductive layer on the side of the interposer substrate distal from the carrier substrate by using a conductive material;
patterning the conductive layer to form the conductive structure in the interposer via hole; and
forming the thin-film transistor on the interposer substrate having the conductive structure.

9. A display device, comprising: a light-emitting unit and an array substrate according to claim 1, wherein the light-emitting unit is disposed on a side of the thin-film transistor in the array substrate distal from the interposer substrate.

10. The display device according to claim 9, further comprising a drive circuit, wherein the drive circuit is disposed on a side of the interposer substrate distal from the thin-film transistor, and the drive circuit is connected to the bonding connection line in the array substrate.

11. The display device according to claim 9, wherein:
the light-emitting unit comprises one of a micro light-emitting diode, an organic light-emitting diode, and a quantum dot light-emitting diode.

12. A manufacturing method of a display device, comprising:
forming a bonding connection line on a carrier substrate;
forming an interposer substrate on the carrier substrate having the bonding connection line, wherein the interposer substrate has an interposer via hole;
forming a thin-film transistor and a conductive structure in the interposer via hole on a side of the interposer substrate distal from the carrier substrate, wherein the thin-film transistor is electrically connected to the bonding connection line by the conductive structure in the interposer via hole;
forming a light-emitting unit on a side of the thin-film transistor distal from the substrate;
adhering the side of the interposer substrate having the light-emitting unit to a fixed substrate by an ultraviolet adhesive:
peeling off the carrier substrate; and
peeling off the fixed substrate.

13. The method according to claim 12, wherein after peeling off the carrier substrate and before peeling off the fixed substrate, the method further comprises:
forming a drive circuit on a side of the interposer substrate having the bonding connection line by a bonding process, wherein the drive circuit is connected to the bonding connection line.

14. The method according to claim 12, wherein peeling off the fixed substrate comprises:
irradiating the ultraviolet adhesive with ultraviolet light from a side of the fixed substrate distal from the interposer substrate to separate the fixed substrate from the light-emitting unit.

* * * * *